(12) United States Patent
Azar et al.

(10) Patent No.: US 12,512,389 B1
(45) Date of Patent: Dec. 30, 2025

(54) THERMAL MANAGEMENT MULTI-LOOP TRANSPORT APPARATUS, AND RELATED METHODS

(71) Applicant: Advanced Thermal Solutions, Inc., Norwood, MA (US)

(72) Inventors: Kaveh Azar, Quincy, MA (US); Bahman Tavassoli Hojati, Norton, MA (US)

(73) Assignee: Advanced Thermal Solutions, Inc., Norwood, MA (US)

( * ) Notice: Subject to any disclaimer, the term of this patent is extended or adjusted under 35 U.S.C. 154(b) by 268 days.

(21) Appl. No.: 18/140,804

(22) Filed: Apr. 28, 2023

Related U.S. Application Data

(60) Provisional application No. 63/337,384, filed on May 2, 2022.

(51) Int. Cl.
*H01L 23/00* (2006.01)
*F28D 15/04* (2006.01)
*H01L 23/427* (2006.01)

(52) U.S. Cl.
CPC ............ *H01L 23/427* (2013.01); *F28D 15/04* (2013.01)

(58) Field of Classification Search
CPC .............................. H01L 23/427; F28D 15/04
(Continued)

(56) References Cited

U.S. PATENT DOCUMENTS 6,269,866 B1 * 8/2001 Yamamoto .......... F28D 15/0233
174/15.2
6,330,907 B1 * 12/2001 Ogushi ................ F28D 15/043
165/907

(Continued)

FOREIGN PATENT DOCUMENTS

CN 106767070 5/2017
CN 110243217 9/2019
CN 111351383 6/2020

OTHER PUBLICATIONS

Ku, Jentung, "Operating Characteristics of Loop Heat Pipes", 29th International Conference on Environmental System, Jul. 15-19, 1999.

(Continued)

*Primary Examiner* — Zhengfu J Feng
(74) *Attorney, Agent, or Firm* — Lieberman & Brandsdorfer, LLC

(57) ABSTRACT

Embodiments relate to a thermal management apparatus including an evaporator plate (EP) configured to receive heat from a heat source, a condenser plate (CP) including at least one reservoir, and a wick plate (WP) positioned between the EP and CP. The WP includes a plurality of wick cells and a return passage. The wick cells include a first wick cell and a second wick cell separate from one another and nested in the WP. The first and second wick cells respectively include first and second wick materials constructed to permit capillary transport of fluid from the CP reservoir to the evaporator plate. The return passage is separate from the first and second wick cells and fluidly communicates the evaporator plate with the CP reservoir. The EP, CP, and WP establish a two-phase multi-loop transport structure including at least the plurality of wick cells, the return passage, and the CP reservoir.

20 Claims, 8 Drawing Sheets

(58) Field of Classification Search
USPC .......................................................... 361/700
See application file for complete search history.

(56) References Cited

U.S. PATENT DOCUMENTS

| | | | | |
|---|---|---|---|---|
| 6,981,543 | B2* | 1/2006 | Chesser | G06F 1/20 |
| | | | | 165/122 |
| 8,705,236 | B2* | 4/2014 | Uchida | F28D 15/046 |
| | | | | 165/104.33 |
| 9,273,910 | B2 | 3/2016 | Wenger | |
| 2005/0082158 | A1* | 4/2005 | Wenger | F28D 15/043 |
| | | | | 159/901 |
| 2014/0137581 | A1* | 5/2014 | Cho | F28D 15/0266 |
| | | | | 62/119 |
| 2017/0167798 | A1* | 6/2017 | Espersen | F28D 15/025 |
| 2020/0116437 | A1* | 4/2020 | Zhang | F28D 15/0266 |
| 2020/0326132 | A1* | 10/2020 | Li | F28D 15/04 |
| 2021/0043544 | A1* | 2/2021 | Eid | H01L 23/481 |
| 2021/0136956 | A1* | 5/2021 | Paavola | F28D 15/0275 |
| 2023/0332839 | A1* | 10/2023 | Megaridis | F28D 15/04 |

OTHER PUBLICATIONS

Hogue, Christoper William, "An Experimental Study of Enhanced Thermal Conductivity Utilizing Columnated Silicon Microevaporators for Convective Boiling Heat Transfer at the Microscale", Dissertation, (2011).
Dhillon, Navdeep Singh, "Micro-Columnated Loop Heat Pipe: The Future of Electronic Substrates", Dissertation, (2012).
Swales Aerospace, "Miniature Multiple Evaporator Multiple Condenser Loop Heat Pipe", 19th Annual AIAA/USU Conference on Small Satellites, (2005).
Ku, Jentung, et al., "Miniature Loop Heat Pipe with Multiple Evaporators for Thermal Control of Small Spacecraft", Paper No. 183, (2005).
Lee, HoSung, "Loop Heat Pipe for Electronics", (2015).
Hirasawa, Shigeki, et al., "Heat Transfer and Flow Analysis in Loop Heat Pipe with Multiple Evaporators Using Network Model", Journal of Mechanics Engineering and Automation 6 (2016), pp. 319-325.
Yakomaskin, A.A., et al., "Feasibility Study of Loop Heat Pipes with Flat Microchannel Evaporator and Non-Metal Wick", 10th International Heat Pipe Symposium (2011).
Kariya, Harumichi Arthur, "Development of an Air-Cooled, Loop-Type Heat Pipe with Multiple Condensers", Thesis (2012).

* cited by examiner

THERMAL MANAGEMENT MULTI-LOOP TRANSPORT APPARATUS, AND RELATED METHODS

CROSS REFERENCE TO RELATED APPLICATION(S)

This application claims the benefit of priority to provisional U.S. Patent Application No. 63/337,384, filed in the U.S. Patent & Trademark Office on May 2, 2022, titled "Thermal Management Apparatus, and Related Methods", the complete disclosure of which is hereby incorporated by reference.

BACKGROUND

The present embodiments relate to, among other things, a thermal management apparatus, and methods of making and using the same. In certain embodiments, the thermal management apparatus and methods are implemented for electronics thermal management.

Artificial intelligence and other sophisticated computing typically require the use of chips equipped with powerful processors and other electronic components. As the quantity and power of processors and electronic components have increased over time, so has the amount of generated heat byproduct. Heat byproduct removal is important for avoiding interruptions of operation and thermal breakdown of electronic components, such as chips.

SUMMARY

The embodiments include, but are not limited to, thermal management apparatuses and methods of making and using the same. This Summary is provided to introduce a selection of representative concepts in a simplified form, which concepts are further described below in the Detailed Description. This Summary is not intended to identify key features or essential features of the claimed subject matter, nor is it intended to be used to limit the scope of the claimed subject matter.

In one aspect, a thermal management apparatus is provided that includes an evaporator plate (EP) configured to receive heat from a heat source, a condenser plate (CP) including at least one reservoir, and a wick plate (WP) positioned between the EP and CP. The WP includes a plurality of wick cells and a return passage. The wick cells include a first wick cell and a second wick cell separate from one another and nested in the WP. The first and second wick cells respectively include first and second wick materials constructed to permit capillary transport of fluid from the CP reservoir to the evaporator plate. The return passage is separate from the first and second wick cells and fluidly communicates the evaporator plate with the CP reservoir. The EP, CP, and WP establish a two-phase multi-loop transport structure including at least the plurality of wick cells, the return passage, and the CP reservoir.

In another aspect, a thermal management method includes providing a thermal management apparatus including an evaporator plate (EP) configured to receive heat from a heat source, a condenser plate (CP) including at least one reservoir, and a wick plate (WP) positioned between the EP and CP. The WP includes a plurality of wick cells and a return passage. The wick cells include a first wick cell and a second wick cell separate from one another and nested in the WP. The first and second wick cells respectively include first and second wick materials constructed to permit capillary transport of fluid from the CP reservoir to the evaporator plate. The return passage is separate from the first and second wick cells and fluidly communicates the evaporator plate with the CP reservoir. The EP, CP, and WP establish a two-phase multi-loop transport structure including at least the plurality of wick cells, the return passage, and the CP reservoir. A heat source is positioned in proximity to the EP. Heat-transfer fluid in or in proximity to the EP is evaporated in response to heat received by the heat source to generate vapor. The vapor is transported via the WP return passage to the at least one reservoir and the vapor is condensed into a condensed liquid. The condensed liquid is transported along the first and second wick cells via capillary transport to the EP for evaporation.

These and other features and advantages will become apparent from the following detailed description of the exemplary embodiment(s), taken in conjunction with the accompanying drawings.

BRIEF DESCRIPTION OF THE SEVERAL VIEWS OF THE DRAWINGS

The drawings referenced herein form part of the specification and are incorporated herein in their entirety. Features shown in the drawings are meant as illustrative of only some embodiments, and not of all embodiments, unless otherwise explicitly indicated.

DETAILED DESCRIPTION

It will be readily understood that the components and features of the exemplary embodiments, as generally described and illustrated in the Figures herein, may be arranged and designed in a wide variety of different configurations. Thus, the following detailed description of the exemplary embodiments, as presented in the Figures, is not intended to limit the scope of the embodiments, as claimed, but is merely representative of selected embodiments.

Reference throughout this specification to "a select embodiment," "an embodiment," "an exemplary embodiment," "one embodiment," or "at least one embodiment" means that a particular feature, structure, or characteristic described in connection with the embodiment is included in at least an embodiment. Thus, appearances of the phrases "a select embodiment," "an embodiment," "an exemplary embodiment," "in one embodiment," or "at least one embodiment" in various places throughout this specification are not necessarily referring to the same embodiment or different embodiments. The various embodiments may be combined with one another in various combinations that would be understood to those skilled in the art having reference to this disclosure.

The illustrated embodiments will be best understood by reference to the drawings, wherein like parts are designated by like numerals throughout. The following description is intended only by way of example, and simply illustrates certain selected embodiments of the apparatus and method that are consistent with the embodiments as claimed herein.

Figure 1A:
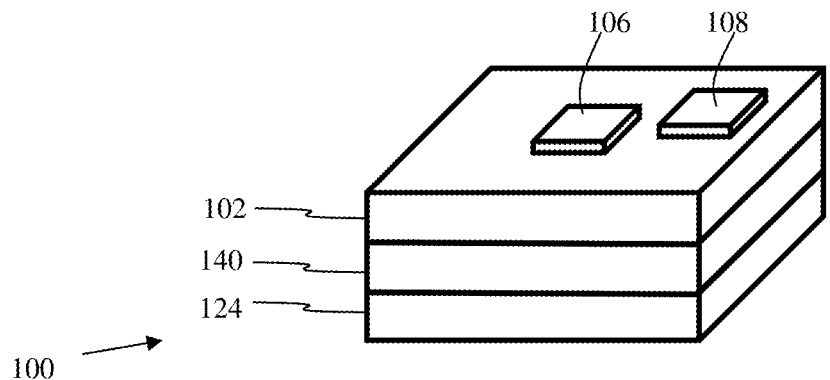
FIG. 1A depicts a perspective view of a thermal management apparatus with first and second electronics chips mounted thereon.
Figure 1B:
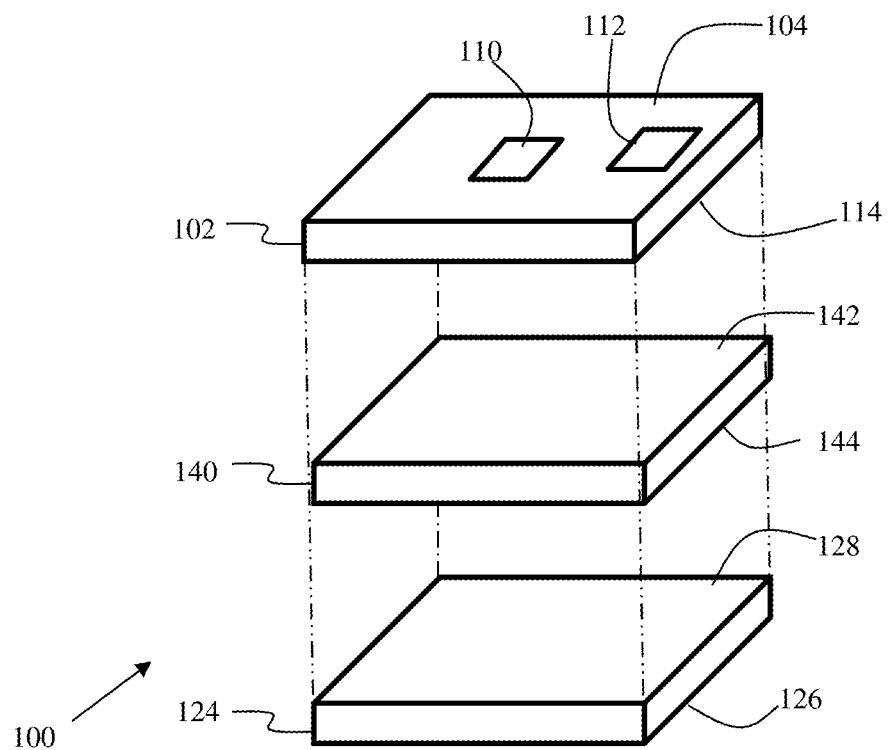
FIG. 1B depicts an exploded, perspective view of the thermal management apparatus of FIG. 1A.

Referring now more particularly to FIGS. 1A and 1B, a thermal management apparatus (also sometimes referred to herein as "the apparatus" in the interest of brevity) is generally designated by reference numeral (100). The apparatus (100) includes an evaporator plate (102), which is also sometimes referred to herein and in the accompanying claims as "EP" in the interest of brevity. The EP (102) has a first (or outer) EP surface (104) with one or more heat source receiving areas (110) and (112). For the purposes of illustration, electronic components such as microprocessor chips (106) and (108) are positioned on the heat source receiving areas (110) and (112), respectively. The EP (102) has a second (or inner) EP surface (114) that is opposite to the outer EP surface (104).

The apparatus (100) further includes a condenser plate (124), which is also sometimes referred to herein and in the accompany claims as "CP" in the interest of brevity. The CP (124) has a first (or outer) CP surface (126) facing away from the EP (102) and an opposite second (or inner) CP surface (128) facing toward the EP (102).

Still referring to FIGS. 1A and 1B, the apparatus (100) further includes a wick plate (140), which is also sometimes referred to herein and the accompanying drawings as the "WP" in the interest of brevity. The WP (140) has a first WP surface (142) facing the EP (102) and an opposite second WP surface (144) facing the CP (124). The WP (140) is positioned between the EP (102) and the CP (124). In an exemplary embodiment, the EP (102), the CP (124), and the WP (140) are distinct plates, e.g. components, connected to one another using one or more fasteners, adhesives, welding, and/or other connection methodologies. In another exemplary embodiment, the EP (102), the CP (124), and the WP (140) are made of a single, integral member, e.g., formed by a molding process.

Figure 2A:
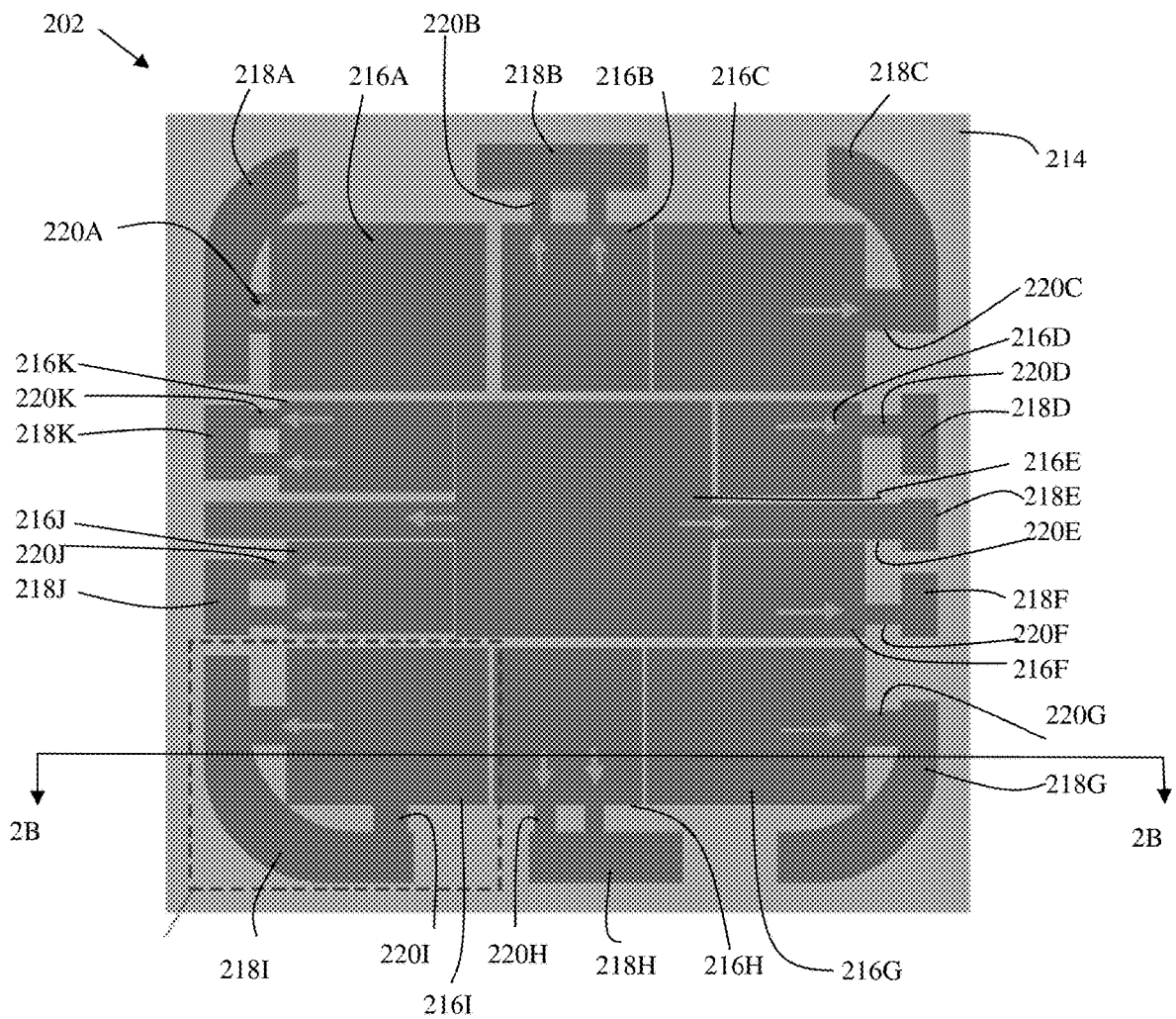
FIG. 2A depicts a bottom view of a first embodiment of an evaporator plate suited for the thermal management apparatus of FIGS. 1A and 1B.
Figure 2B:
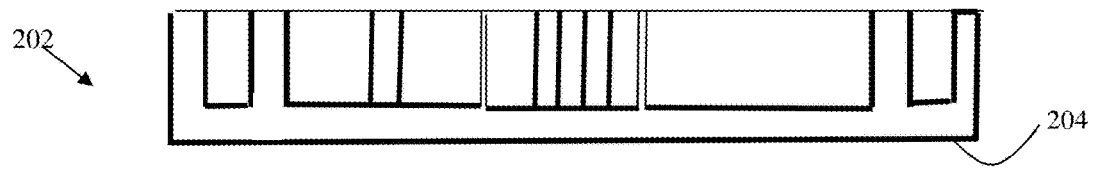
FIG. 2B depicts a side cross-sectional view of the evaporator plate of FIG. 2A taken along sectional line 2B-2B of FIG. 2A.

As best shown in FIGS. 2A and 2B, a first embodiment of an evaporator plate (EP), generally designated by reference numeral (202), suited for use as the evaporator plate (102) of the thermal management apparatus (100) of FIGS. 1A and 1B. The EP (202) includes an outer surface (204) and an inner surface (214).

The EP (202) of the embodiment of FIGS. 2A and 2B includes one or more EP pockets (also referred to herein as EP chambers) (216A)-(216K). The EP pockets (216A)-(216K) may be recessed into the inner EP surface (214) or positioned within the EP (202) between the outer and inner surface (204) and (214), respectively. In an exemplary embodiment, one or more of the EP pockets (216A)-(216K) are positioned directly opposite to respective heat-receiving areas, such as heat-receiving areas (110) and (112) on the outer EP surface (104) of FIGS. 1A and 1B. In an embodiment, the EP pockets (216A)-(216K) are separate (e.g., spaced) and discrete with respect to one another, with raised walls (best shown in FIG. 2B) separating the EP pockets (216A)-(216K). The EP pockets (216A)-(216K) may each have identical depths. In an alternative embodiment, the depths of the EP pockets (216A)-(216K) may differ from one another. While FIG. 2A depicts the EP (202) with eleven EP pockets (216A)-(216K), it should be understood that this quantity is by way of example, and that the EP (202) may have a lesser or greater quantity of EP pockets, or no EP pockets.

The EP (202) of the embodiment of FIGS. 2A and 2B further includes a discontinuous channel comprising a plurality of EP channel segments (218A)-(218K). In an exemplary embodiment, the EP channel segments (218A)-(218K) are recessed into the second EP surface (214). In another exemplary embodiment, the EP channel segments (218A)-(218K) are positioned within the EP (202) between the outer and inner surface (204) and (214), respectively. As best shown in FIG. 2A, in an exemplary embodiment the EP channel segments (218A)-(218K) are positioned around the periphery of the EP pockets (216A)-(216K).

In an embodiment, the EP channel segments (218A)-(218K) are separate (e.g., spaced) and discrete with respect to one another, with raised walls (unnumbered) separating the EP channel segments (218A)-(218K). The EP channel segments (218A)-(218K) may each have identical depths. Alternatively, the depths of the EP channel segments (218A)-(218K) may differ from one another. While FIG. 2A depicts the EP (202) with eleven EP channel segments (218A)-(218K), it should be understood that this quantity is by way of example, and that the EP (202) may have a lesser or greater quantity of EP channel segments (218A)-(218K). In an embodiment, the quantity of EP channel segments (218A)-(218K) is equal to the quantity of EP pockets (216A)-(216K).

The EP (202) of the embodiment of FIGS. 2A and 2B further includes one or more EP ducts (220A)-(220K). In an exemplary embodiment, the EP ducts (220A)-(220K) are recessed into the second EP surface (214). In another exemplary embodiment, the EP ducts (220A)-(220K) are positioned within the EP (202) between the outer and inner surface (204) and (214), respectively. In an exemplary embodiment shown in FIGS. 2A and 2B, the EP ducts (220A)-(220K) place the EP pockets (216A)-(216K) in fluid communication with the EP channel segments (218A)-(218K), respectively. In certain instances, such as with respect to the EP pocket (216C) and the EP channel segment (218C), a single EP duct (220C) provides the fluid communication between the corresponding EP pocket (216C) and EP channel segment (218C). In other instances, such as with respect to the EP pocket (216B) and the EP channel segment (218B), a plurality of EP ducts (220B) provide the fluid communication between the corresponding EP pocket (216B) and the EP channel segment (218B). The depths of the EP pockets (216A)-(216K), the EP channel segments (218A)-(218K), and the EP ducts (220A)-(220K) may be the same or different from one another.

Figure 3A:
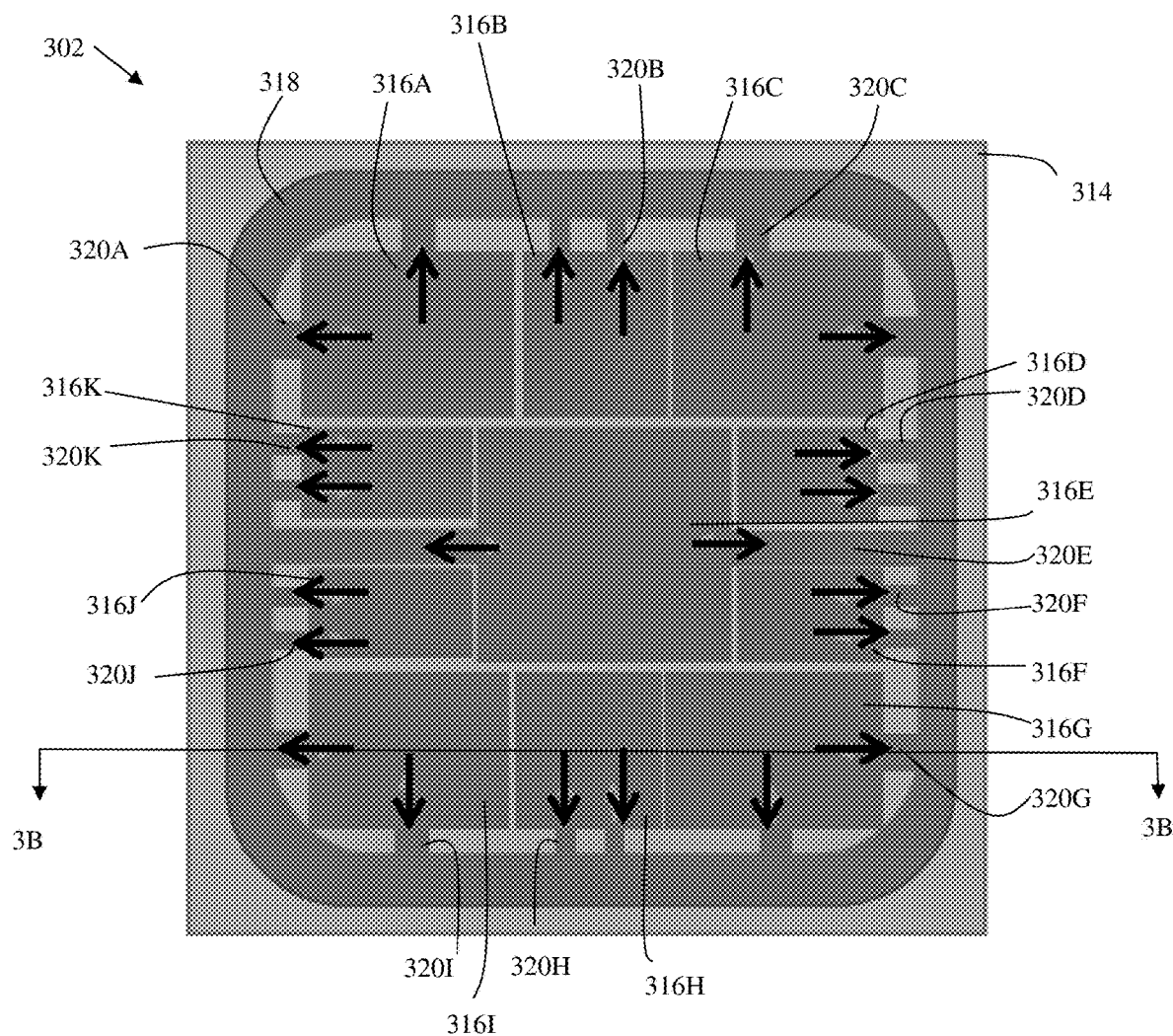
FIG. 3A depicts a bottom view of a second embodiment of an evaporator plate suited for the thermal management apparatus of FIGS. 1A and 1B.
Figure 3B:
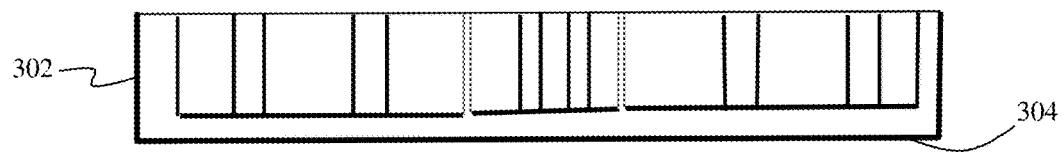
FIG. 3B depicts a side cross-sectional view of the evaporator plate of FIG. 3A taken along sectional line 3B-3B of FIG. 3A.

As best shown in FIGS. 3A and 3B, a second embodiment of an evaporator plate (EP), generally designated by reference numeral (302), suited for use as the evaporator plate (102) of the thermal management apparatus (100) of FIGS. 1A and 1B. The evaporator plate (302) includes an outer surface (304) and an inner surface (314).

The evaporator plate (302) of the embodiment of FIGS. 3A and 3B includes one or more EP pockets (also referred to herein as EP chambers) (316A)-(316K) recessed into the inner EP surface (314). In another exemplary embodiment, the EP pockets (316A)-(316K) are positioned within the EP (302), between the outer and inner surfaces (304) and (314), respectively. In an exemplary embodiment, one or more of the EP pockets (316A)-(316K) are positioned directly opposite to respective heat-receiving areas, such as heat-receiving areas (110) and (112) on the outer EP surface (104) of FIGS. 1A and 1B. In an embodiment, the EP pockets (316A)-(316K) are separate (e.g., spaced) and discrete with respect to one another, with raised walls (best shown in FIG. 3B) separating the EP pockets (316A)-(316K). The EP pockets (316A)-(316K) may each have identical depths. In an alternative embodiment, the depths of the EP pockets (316A)-(316K) may differ from one another. While FIG. 3A depicts the EP (302) with eleven EP pockets (316A)-(316K), it should be understood that this quantity is by way of example, and that the EP (302) may have a lesser or greater quantity of EP pockets, or no EP pockets.

The EP (302) of the embodiment of FIGS. 3A and 3B further includes a continuous channel (318). In an exemplary embodiment, the continuous channel (318) is recessed into the second EP surface (314). In another embodiment, the continuous channel (318) is positioned within the EP (302), between the outer and inner surfaces (304) and (314), respectively. As best shown in FIG. 3A, in an exemplary embodiment the continuous channel (318) is positioned around the periphery of the EP pockets (316A)-(316K).

The EP (302) of the embodiment of FIGS. 3A and 3B further includes one or more EP ducts (320A)-(320K). In an exemplary embodiment, the EP ducts (320A)-(320K) are recessed into the second EP surface (314). In another exemplary embodiment, the EP ducts (320A)-(320K) are positioned within the EP (302), between the outer and inner surfaces (304) and (314), respectively. In an exemplary embodiment shown in FIGS. 3A and 3B, the EP ducts (320A)-(320K) place the EP pockets (316A)-(316K) in fluid communication with the continuous channel (318). In certain instances, such as with respect to the EP pocket (316A), multiple EP ducts (320A) provide the fluid communication between the corresponding EP pocket (316A) and the continuous channel (318). In other instances, a single EP duct may provide the fluid communication between the corresponding EP pocket and the continuous channel. The depths of the EP pockets (316A)-(316K), the continuous channel (318), and the EP ducts (320A)-(320K) may be the same or different from one another.

Figure 4A:
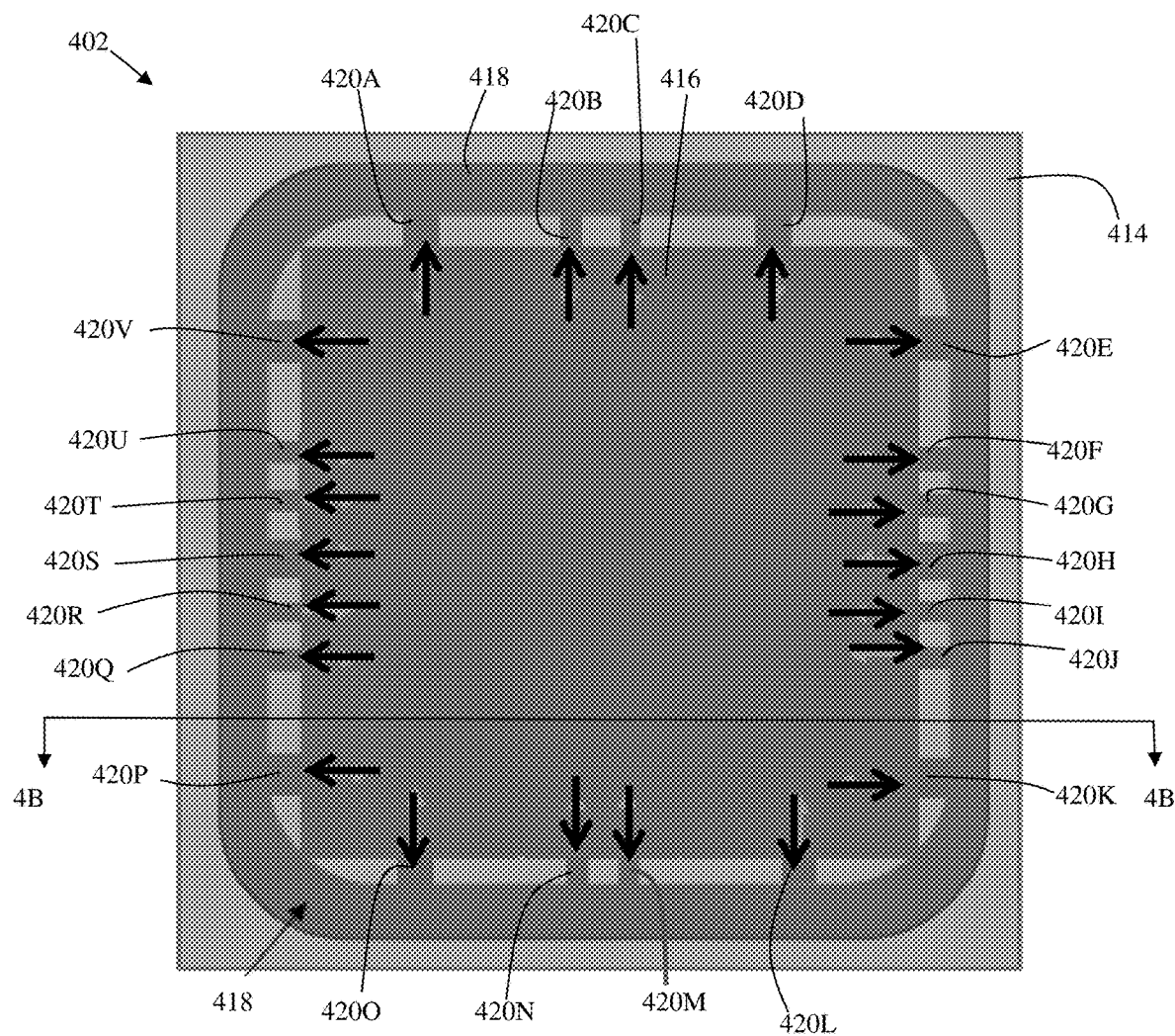
FIG. 4A depicts a bottom view of a third embodiment of an evaporator plate suited for the thermal management apparatus of FIGS. 1A and 1B.
Figure 4B:
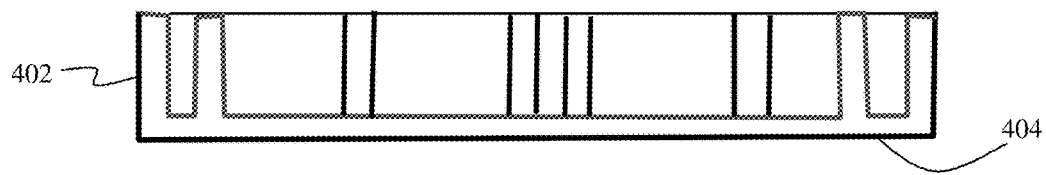
FIG. 4B depicts a side cross-sectional view of the evaporator plate of FIG. 4A taken along sectional line 4B-4B of FIG. 4A.

As best shown in FIGS. 4A and 4B, a third embodiment of an evaporator plate (EP), generally designated by reference numeral (402), suited for use as the evaporator plate (102) of the thermal management apparatus (100) of FIGS. 1A and 1B. The EP (402) includes an outer surface (404) and an inner surface (414).

The EP (402) of the embodiment of FIGS. 4A and 4B includes a single or common EP pocket (also referred to herein as an EP chamber) (416) recessed into the inner EP surface (414). In another embodiment, the EP pocket (416) is positioned within the EP (402), between the outer and inner surfaces (404) and (414), respectively. In an exemplary embodiment, the EP pocket (416) is positioned directly opposite to respective heat-receiving areas, such as heat-receiving areas (110) and (112) on the outer EP surface (104) of FIGS. 1A and 1B. The EP pocket (416) is shown having a constant depth, although the depth may vary.

The EP (402) of the embodiment of FIGS. 4A and 4B further includes a continuous channel (418) similar to continuous channel (318) described above in connection with FIG. 3A. In an exemplary embodiment, the continuous channel (418) is recessed into the second EP surface (414). In another embodiment, the continuous channel (418) is positioned within the EP (402), between the outer and inner surfaces (404) and (414), respectively. As best shown in FIG. 4A, in an exemplary embodiment the continuous channel (418) is positioned around the periphery of the common EP pocket (416).

The EP (402) further includes one or more EP ducts (420A)-(420V). In an exemplary embodiment, the EP ducts (420A)-(420V) are recessed into the second EP surface (414). In another embodiment, the EP ducts (420A)-(420V) are positioned within the EP (402), between the outer and inner surfaces (404) and (414), respectively. In an exemplary embodiment shown in FIGS. 4A and 4B, the EP ducts (420A)-(420V) place the common EP pocket (416) in fluid communication with the continuous channel (418). The depths of the EP pocket (416), the continuous channel (418), and the EP ducts (420A)-(420V) may be the same or different from one another.

Figure 5A:
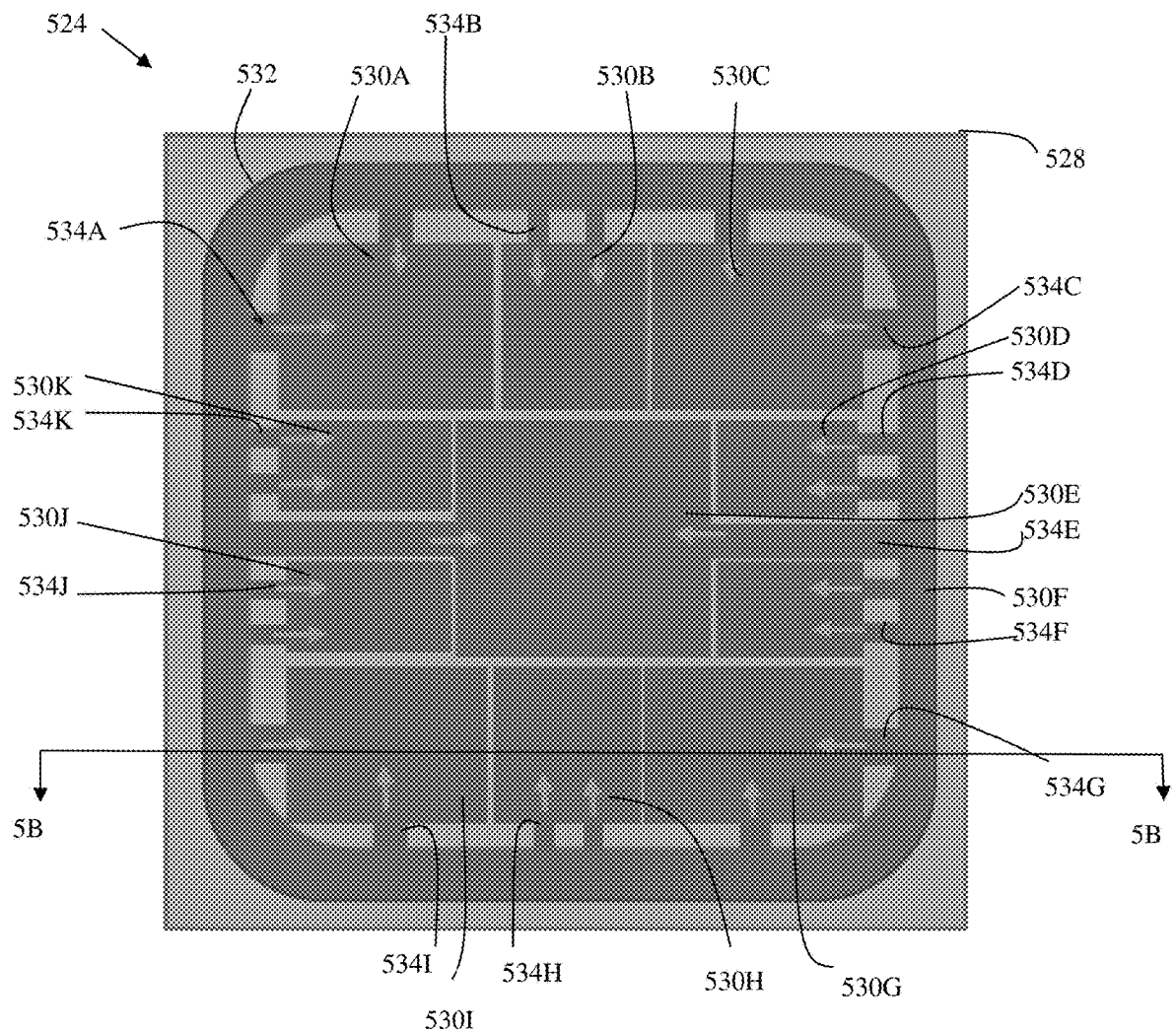
FIG. 5A depicts a top view of an embodiment of a condenser plate suitable for the thermal management apparatus of FIGS. 1A and 1B.
Figure 5B:
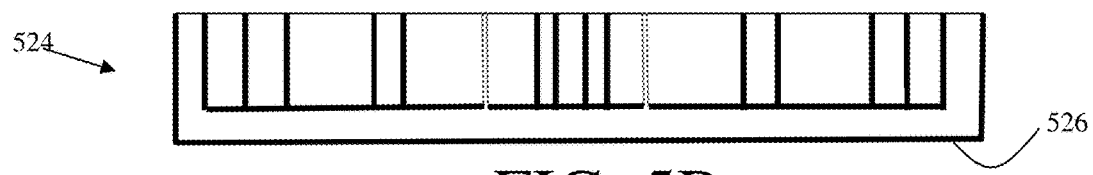
FIG. 5B depicts a side cross-sectional view of the condenser plate of FIG. 5A taken along sectional line 5B-5B of FIG. 5A.

As best shown in FIGS. 5A and 5B, an embodiment of a condenser plate (CP), generally designated by reference numeral (524), suited for use as the condenser plate (124) of the thermal management apparatus (100) of FIGS. 1A and 1B. The CP (524) includes a first (or outer) surface (526) and a second (or inner) surface (528).

The CP (524) of the embodiment of FIGS. 5A and 5B includes one or more reservoir compartments (530A)-(530K) recessed into the inner CP surface (528). In another embodiment, the compartments (530A)-(530K) are positioned within the CP (524), between the outer and inner surfaces (526) and (528), respectively.

In an exemplary embodiment, the one or more of the reservoir compartments (530A)-(530K) are positioned directly opposite to the EP pockets (216A)-(216K) of the EP plate (202) of FIGS. 2A and 2B, directly opposite to the EP pockets (316A)-(316K) of the EP plate (302) of FIGS. 3A and 3B, or directly opposite to the EP pocket (416) of the EP plate (402) of FIGS. 4A and 4B.

In an embodiment, the reservoir compartments (530A)-(530K) are separate (e.g., spaced) and discrete with respect to one another, with raised walls (best shown in FIG. 5B) separating the reservoir compartments (530A)-(530K). The reservoir compartments (530A)-(530K) may each have identical depths. In an alternative embodiment, the depths of the reservoir compartments (530A)-(530K) may differ from one another. While FIG. 5A depicts the CP (524) with eleven reservoir compartments (530A)-(530K), it should be understood that this quantity is by way of example, and that the CP (524)) may have a lesser or greater quantity of reservoir compartments.

The CP (524) of the embodiment of FIGS. 5A and 5B further includes a continuous channel (532). In an exemplary embodiment, the continuous channel (532) is recessed into the second EP surface (528). In another embodiment, the continuous channel (532) is positioned within the CP (524) between the outer and inner surfaces (526) and (528), respectively. As best shown in FIG. 5A, in an exemplary embodiment the continuous channel (532) is positioned around the periphery of the reservoir compartments (530A)-(530K).

In an embodiment, the continuous channel (532) has a constant depth. In another embodiment, the depth of the continuous channel (532) may vary. In another embodiment, the continuous channel of the CP (524) may be separated into a plurality of discontinuous channel segments (not shown), which may have the same or different depths with respect to one another.

The CP (524) further includes one or more CP ducts (534A)-(534K). In an exemplary embodiment, the CP ducts (534A)-(534K) are recessed into the second CP surface (528). In another embodiment, the CP ducts (534A)-(534K) are positioned within the CP (524) between the outer and inner surfaces (526) and (528), respectively.

In an exemplary embodiment shown in FIGS. 5A and 5B, the CP ducts (534A)-(534K) place the reservoir compartments (530A)-(530K) in fluid communication with the CP continuous channel (532). The depths of the reservoir compartments (530A)-(530K), the CP channel (532), and the CP ducts (534A)-(534K) may be the same or different from one another.

In another embodiment, in the same manner that the condenser plate (524) of the embodiment of FIGS. 5A and 5B is substantially the mirror image of the evaporator plate (302) of FIGS. 3A and 3B, the condenser plate (524) may be modified to include discontinuous channel segments in place of CP continuous channel (532). The resulting modified condenser plate is the mirror image of the evaporator plate (202) of FIGS. 2A and 2B.

Figure 6A:
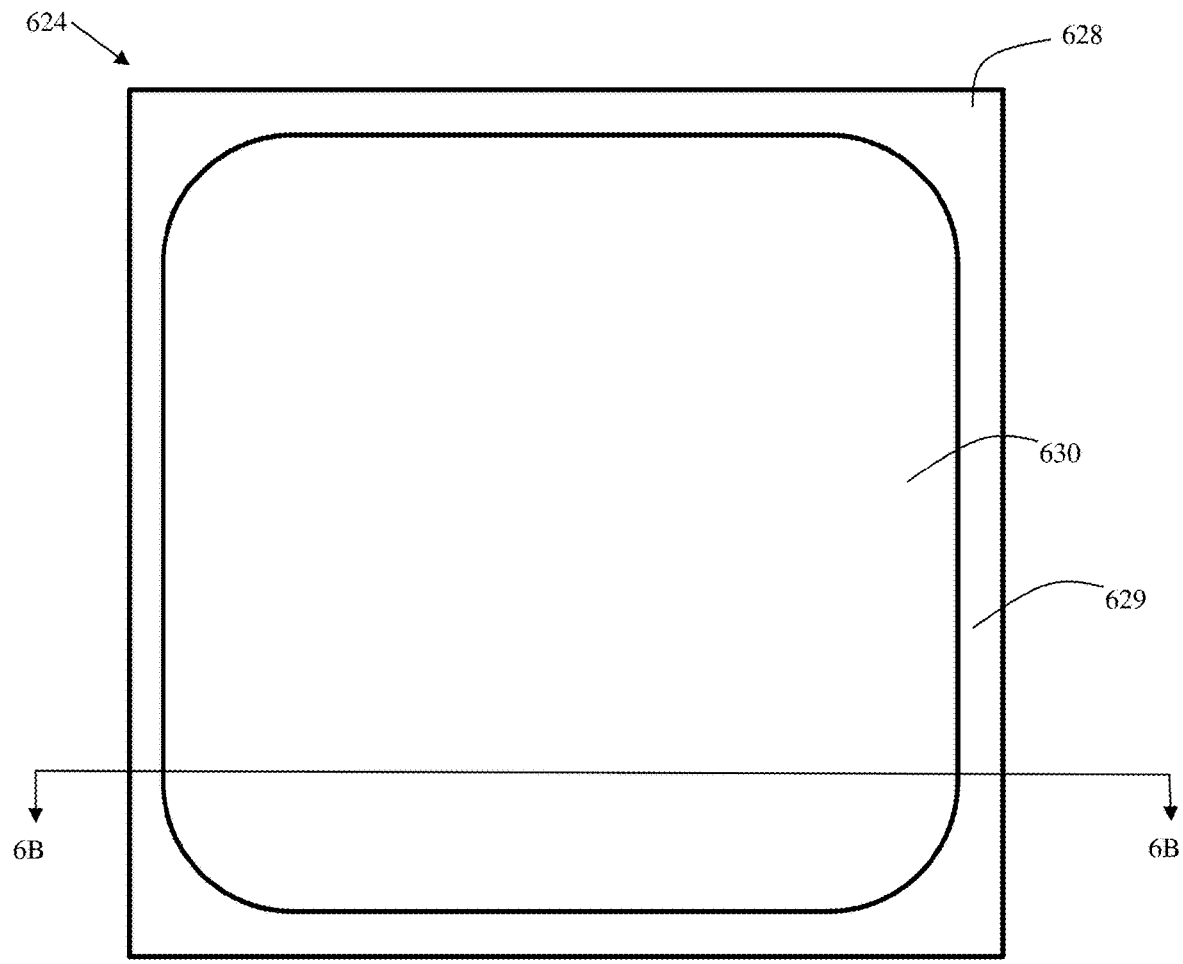
FIG. 6A depicts a top view of another embodiment of a condenser plate suitable for the thermal management apparatus of FIGS. 1A and 1B.
Figure 6B:
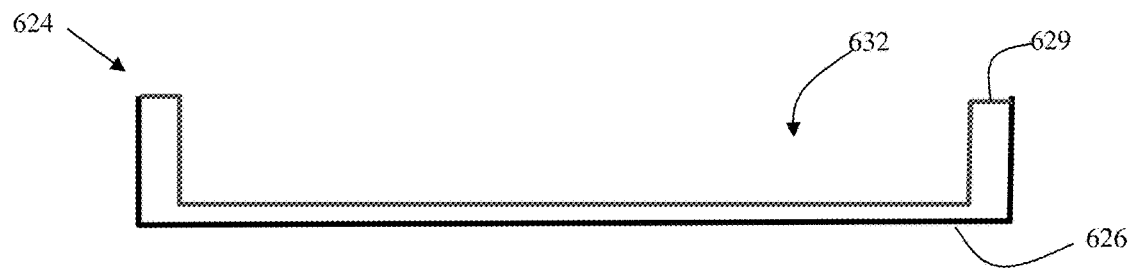
FIG. 6B depicts a side cross-sectional view of the condenser plate of FIG. 6A taken along sectional line 6B-6B of FIG. 6A.

A condenser plate (CP) according to another embodiment is generally referred to by reference numeral (624) in FIGS. 6A and 6B. The condenser plate (624) includes a first (or outer) surface (626) and a second (or inner) surface (628). The inner surface (628) includes a wall portion (629) surrounding a reservoir (630). In another embodiment, the reservoir (630) is positioned within the CP (624) between the outer and inner surfaces (626) and (628), respectively.

In FIG. 6B, the reservoir (630) is shown with a constant depth, although it should be understood that the depth of the reservoir (630) may vary. Further, while the condenser plate (624) is shown with a single reservoir (630) in FIGS. 6A and 6B, it should be understood that the condenser plate (624) may include a plurality of reservoir compartments in communication with one another or out of communication with one another.

Figure 7:
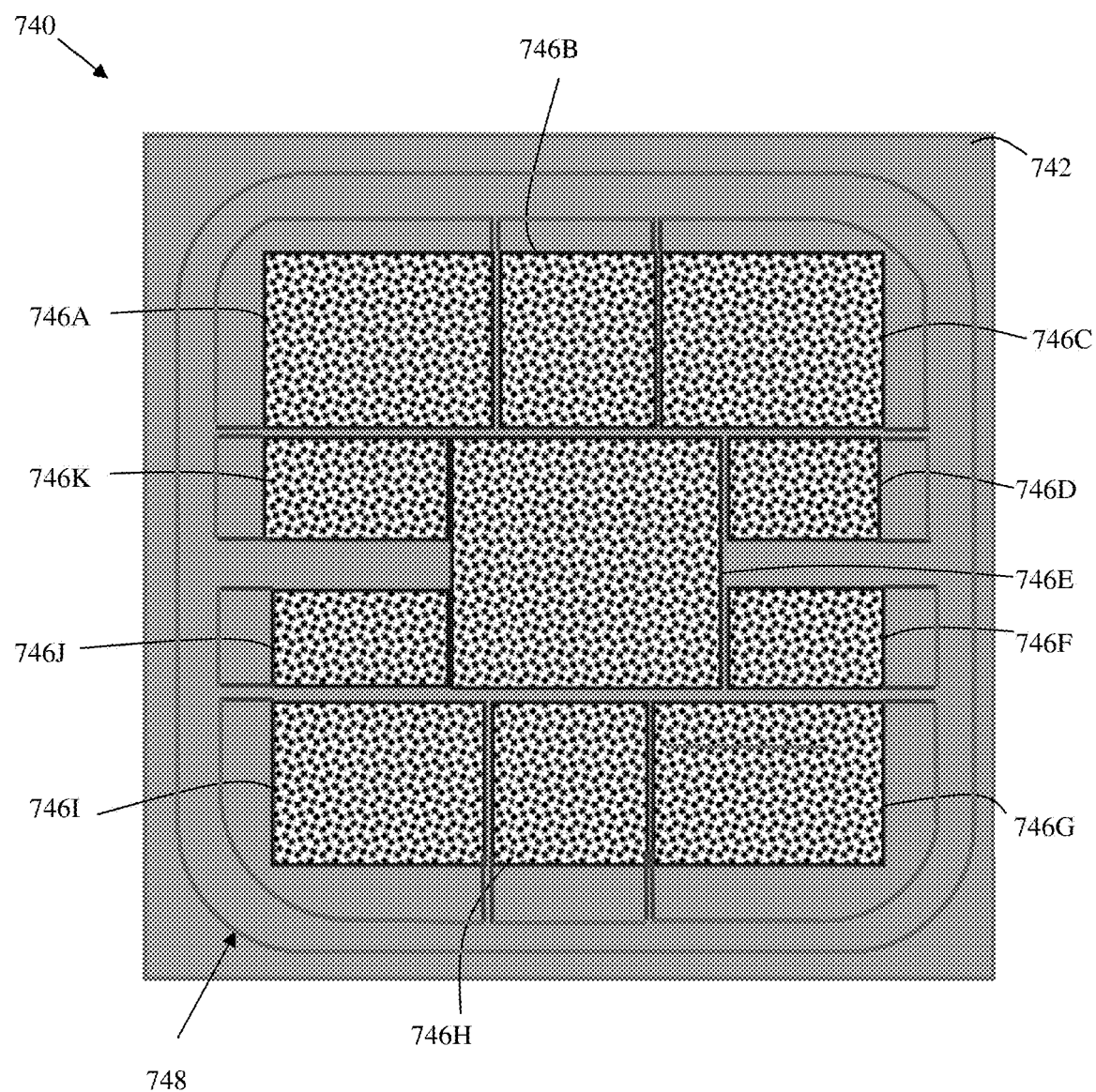
FIG. 7 depicts a top view of an embodiment of a wick plate suited for the thermal management apparatus of FIGS. 1A and 1B.

Referring now to FIG. 7, an embodiment of a wick plate (WP) suited for the thermal management apparatus of FIGS. 1A and 1B is generally designated by reference numeral (740). The WP (740) may be used in combination with, for example, any of the embodiments of the EP (e.g., (202), (302), and (402)) described herein and any of the embodiments of the CP (e.g., (524) and (624)) described herein.

The WP (740) includes a first surface (742) shown with a plurality of wick cells (746A)-(746K). The wick cells (746A)-(746K) are nested within the WP (740) so as to be separate (e.g., spaced apart) from one another. For example, wick cell (746A) is separate (e.g., spaced from) wick cell (746B) and other wick cells, e.g., wick cells (746B), (746E), and (746K). In an embodiment, each of the wick cells (746A)-(746K) is in alignment with a corresponding EP pocket (216A)-(216K), respectively, or a corresponding EP pocket (316A)-(316K), respectively. In another embodiment, the wick cells (746A)-(746K) are in alignment with the same or common EP pocket, e.g., the EP pocket (416) of FIG. 4A.

In an embodiment, the wick cells (746A)-(746K) extend continuously from, at least, the opposite surfaces (e.g., surfaces (142) and (144) of FIG. 1B) of the WP (140) or (740). In an embodiment, the wick cells (746A)-(746K) extend continuously from a first end, which may be adjacent to or extend within the CP reservoir compartments (530A)-(530K), respectively, or the CP reservoir (630), to an opposite second end, which may be adjacent to or extend within the EP pocket(s) (e.g., (216A)-(216K), (316A)-(316K), or (416)). Two or more, and in an exemplary embodiment all, of the wick cells (746A)-(746K) form part of respective loops of the apparatus, as described below. In an embodiment, the loops fluidly communicate with one another. In another embodiment, one or more (or all) of the loops do not fluidly communicate with one another, i.e., are fluidly isolated from one another.

The wick cells (746A)-(746K) are made of a material that promotes capillary transfer of a fluid, such as a heat-exchange fluid, from the CP reservoir compartments (530A)-(530K), respectively, or the CP reservoir (630) to the EP pocket(s) (e.g., (216A)-(216K), (316A)-(316K), or (416)) for evaporation.

In an embodiment, any one or more, or all, of the wick cells (746A)-(746K) may be made of one or more wick materials substantially identical to one another in composition, size, and compactness to provide substantially identical rates of capillary transport. For example, the wick cells of any or all of (746A)-(746K) may be made of the same material(s). In another embodiment, any one or more, or all, of the wick cells (746A)-(746K) may be made of one or more wick materials that are different from one another in composition, size, and/or compactness to provide different rates of capillary transport. For example, the wick cells of any one or all of (746A)-(746K) may be made of different material(s). Suitable wick material compositions, sizes, and compactness include those known in the art. The wick materials may be inserted into the wick plate (740). Alternatively, the wick materials may be made from the wick plate (740), e.g., by machining or etching the wick plate (740) to make the integrated wick cells.

The WP (740) of the embodiment of FIG. 7 includes a continuous WP return passage (748) separate (e.g., spaced) from the wick cells (746A)-(746K). In the embodiment depicted in FIG. 7A, the WP return passage (748) forms a continuous loop around the wick cells (746A)-(746K). The continuous WP return passage (748) positions the EP inner surface (114) or the EP pocket(s) (e.g., (216A)-(216K), (316A)-(316K), or (416)) in fluid communication with the CP reservoir compartments (530A)-(530K) or the CP reservoir (630).

The loop systems include at least first and second loops, examples of which are described below.

According to an embodiment, the first loop system includes at least, e.g., the wick cell (746A) for capillary transfer of a liquid (e.g., heat-transfer liquid) from the CP reservoir compartment (530A) or the CP reservoir (630) to the EP pocket (e.g., (216A), (316A), or (416)) for evaporation, the duct (220A), (320A), or (420A), the EP continuous channel (e.g., (318) or (418)) or the EP discontinuous channel (e.g., (218A)), and the WP return passage (748) that positions the EP continuous channel (e.g., (318) or (418)) or the EP discontinuous channel (e.g., (218A)) in fluid communication with the CP channel (532) or the CP reservoir (630).

According to an embodiment, the second loop system includes at least, e.g., the wick cell (746B) for capillary transfer of a liquid (e.g., heat-transfer liquid) from the CP reservoir compartment (530B) or the CP reservoir (630) to the EP pocket (e.g., the EP pocket (216B), (316B), or (416)) for evaporation, the duct (220B), (320B), or (420B), the EP continuous channel (e.g., (318) or (418) or the EP discontinuous channel (e.g., (218B), and the WP return passage (748) that positions the EP continuous channel (e.g., (318) or (418)) or the EP discontinuous channel (e.g., (218A)) in communication with the CP channel (532) or the CP reservoir (630).

Figure 8:
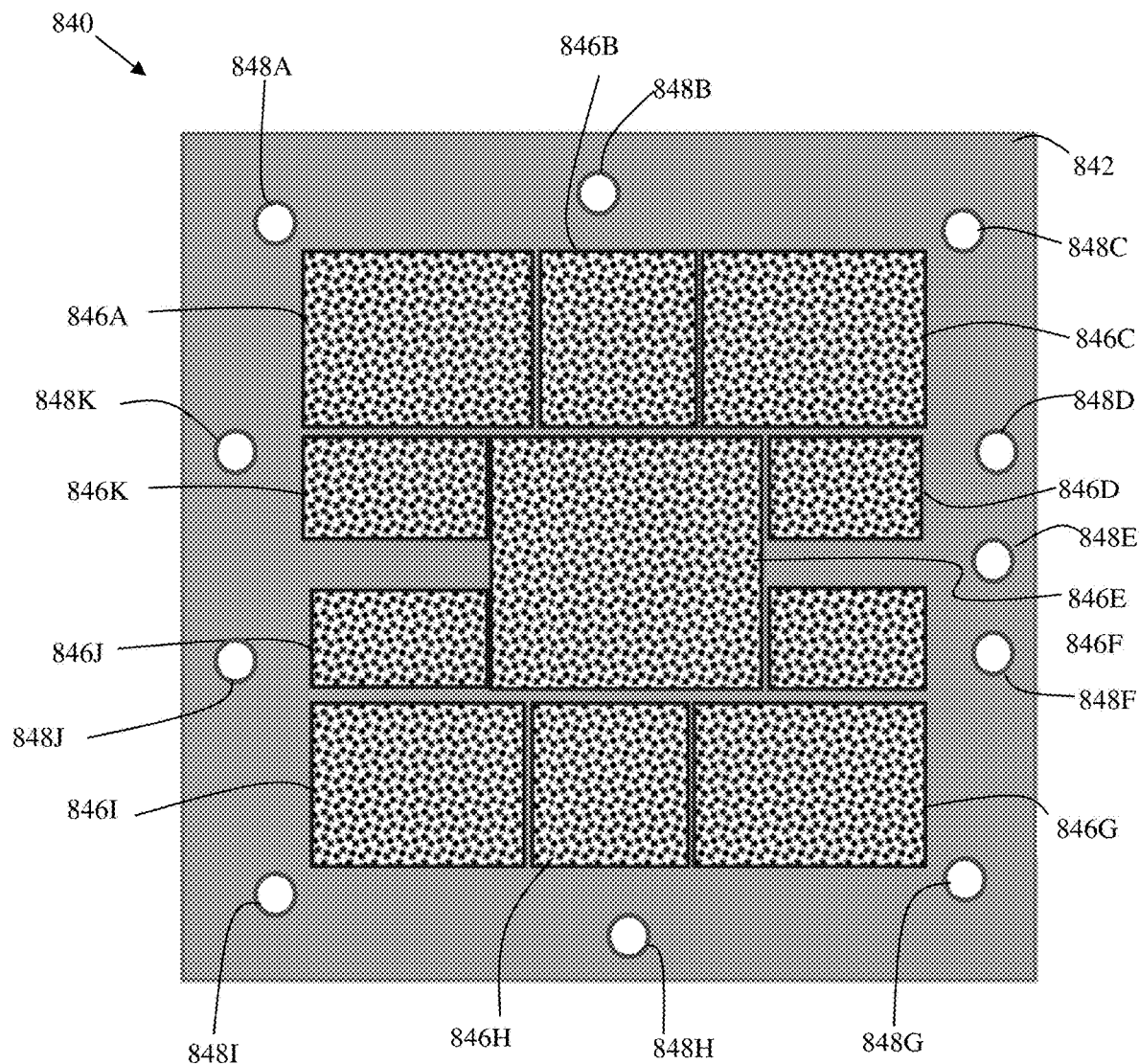
FIG. 8 depicts a top view of another embodiment of a wick plate suited for the thermal management apparatus of FIGS. 1A and 1B.

Referring now to FIG. 8, another embodiment of a wick plate (WP) suited for the thermal management apparatus of FIGS. 1A and 1B is generally designated by reference numeral (840). The WP (840) may be used in combination with, for example, any of the embodiments of the EP (e.g., (202), (302), and (402)) described herein and any of the embodiments of the CP (e.g., (524) and (624)) described herein.

The WP (840) includes a first surface (842) shown with a plurality of wick cells (846A)-(846K). The wick cells (846A)-(846K) are nested within the WP (840) so as to be separate (e.g., spaced apart) from one another. In an embodiment, each of the wick cells (846A)-(846K) is in alignment with a corresponding EP pocket (216A)-(216K), respectively, or a corresponding EP pocket (316A)-(316K), respectively. In another embodiment, the wick cells (846A)-(846K) are in alignment with the same or common EP pocket, e.g., the pocket (416) of FIG. 4A.

In an embodiment, the wick cells (846A)-(846K) extend continuously from, at least, the opposite surfaces (e.g., surfaces (142) and (144) of FIG. 1B) of the WP (140) or (840). In an embodiment, the wick cells (846A)-(846K) extend continuously from the CP reservoir compartments (530A)-(530K), respectively, or the CP reservoir (630) to the EP surface or the EP pocket(s) (e.g., (216A)-(216K), (316A)-(316K), or (416)). Two or more, and in an exemplary embodiment all, of the wick cells (746A)-(746K) form part of respective loops of the apparatus, as described below.

The wick cells (846A)-(846K) may be made of the same materials and have the same characteristics, properties, and variations and modifications as described above in connection with wick cells (724A)-(724K), the description of which is incorporated herein by reference.

The WP (840) includes a plurality of return passages (848A)-(848K) separate (e.g., spaced) from the wick cells (846A)-(846K). In the embodiment depicted in FIG. 8A, the WP return passages (848A)-(848K) collectively form a discontinuous loop around the wick cells (846A)-(846K). The WP return passages (848A)-(848K) position the EP pocket(s) (e.g., (216A)-(216K), (316A)-(316K), or (416)) in fluid communication with the CP channel (532) or the CP reservoir (630).

The loop systems include at least first and second loops, examples of which are described below.

According to an embodiment, the first loop system includes at least, e.g., the wick cell (846A) for capillary transfer of a liquid (e.g., heat-transfer liquid) from the CP reservoir compartment (530A) or the CP reservoir (630) to the EP pocket (e.g., (216A), (316A), or (416)) for evaporation, the duct (220A), (320A), or (420A), the EP continuous channel (e.g., (318) or (418)) or the EP discontinuous channel (e.g., (218A)), and the WP return passage (848A) that positions the EP continuous channel (e.g., (318) or (418)) or the EP discontinuous channel (e.g., (218A)) in fluid communication with the CP channel (532) or the CP reservoir (630).

According to an embodiment, the second loop system includes at least, e.g., the wick cell (846B) for capillary transfer of a liquid (e.g., heat-transfer liquid) from the CP reservoir compartment (530B) or the CP reservoir (630) to the EP pocket (e.g., the EP pocket (216B), (316B), or (416)) for evaporation, the duct (220B), (320B), or (420B), the EP continuous channel (e.g., (318) or (418) or the EP discontinuous channel (e.g., (218B), and the WP return passage (848B) that positions the EP continuous channel (e.g., (318) or (418)) or the EP discontinuous channel (e.g., (218A)) in communication with the CP channel (532) or the CP reservoir (630).

Modifications, variations, and combinations of the above-discussed embodiments fall within the scope of the invention. Certain modifications, variations, and combinations are discussed above.

An embodiment of a thermal management method is now described. According to an embodiment, a heat source is placed in proximity to the thermal management apparatus of any of the embodiments described herein, including any combination of embodiments described herein. In an embodiment, the heat source is positioned adjacent to or on an outer surface of the evaporator plate, such as the surface (104) of the EP (102), the surface (204) of the EP (202), the surface (304) of the EP (302), or the surface (404) of EP (402). Examples of heat sources include the electronic components, e.g., microprocessor chips (106) and (108) of FIG. 1A. The proximity is sufficiently close to cause the heat source to evaporate or vaporize heat-transfer fluid in or in proximity to the evaporator plate.

The vapor is transported via the WP return passage(s) to the reservoir(s). The vapor may be condensed during transport or within the reservoir(s). The condensed liquid is available for transport along the first and second wick cells via capillary transport to the evaporator plate for another cycle of evaporation/vaporization and condensation.

While particular embodiments have been shown and described, it will be understood to those skilled in the art, based upon the teachings herein, that changes and modifications may be made without departing from its broader aspects. Therefore, the appended claims are to encompass within their scope all such changes and modifications as are within the true spirit and scope of the embodiments. Furthermore, it is to be understood that the embodiments are solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to the embodiments containing only one such element, even when the same claim includes the introductory phrases "one or more" or "at least one" and articles such as "a" or "an"; the same holds true for the use in the claims of definite articles. As used herein, the term "and/or" means either or both (or any combination or all of the terms or expressed referred to).

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles of the embodiments and the practical application, and to enable others of ordinary skill in the art to understand the embodiments for various embodiments with various modifications and combinations with one another as are suited to the particular use contemplated. Accordingly, the scope of protection of the embodiment(s) is limited only by the following claims and their equivalents.

What is claimed is:

1. A thermal management apparatus, comprising:
    an evaporator plate (EP) configured to receive heat from a heat source;
    a condenser plate (CP) comprising at least one reservoir; and
    a wick plate (WP) positioned between the EP and the CP, the WP comprising a plurality of wick cells and a return passage, the plurality of wick cells comprising a first wick cell and a second wick cell separate from one another and nested in the WP, the first and second wick cells respectively comprising first and second wick materials constructed to permit capillary transport of fluid from the at least one reservoir to the EP, the return passage being separate from the first and second wick cells and fluidly communicating the EP with the at least one reservoir, wherein the EP, CP, and WP establish a two-phase multi-loop transport structure including at least the plurality of wick cells, the return passage, and the at least one reservoir.

2. The thermal management apparatus of claim 1, wherein the first wick material and the second wick material differ from one another in composition, size, compactness, or any combination thereof to provide the first and second wick cells with different rates of capillary transport.

3. The thermal management apparatus of claim 1, wherein the first wick material and the second wick material are substantially identical to one another in composition, size, and compactness to provide the first and second wick cells with substantially identical rates of capillary transport.

4. The thermal management structure of claim 1, wherein:
    the EP comprises a plurality of EP chambers, the plurality of EP chambers comprising a first EP chamber and a second EP chamber aligned with and fluidly communicating with the first wick cell and the second wick cell, respectively.

5. The thermal management apparatus of claim 1, wherein:
    the EP comprises a plurality of EP chambers, the plurality of EP chambers comprising a first EP chamber and a second EP chamber separate from one another, the first and second EP chambers being aligned with and fluidly communicating with the first wick cell and the second wick cell, respectively;
    the return passage of the WP comprises a common return passage that fluidly communicates the first EP chamber with the at least one reservoir and fluidly communicates the second EP chamber with the at least one reservoir; and
    the two-phase multi-loop transport structure comprises:
        a first loop comprising the at least one reservoir, the first wick cell, the first EP chamber, and the common return passage; and
        a second loop comprising the at least one reservoir, the second wick cell, the second EP chamber, and the common return passage.

6. The thermal management apparatus of claim 1, wherein:
    the EP comprises a plurality of EP chambers, the plurality of EP chambers comprising a first EP chamber and a second EP chamber separate from one another, the first and second EP chambers being aligned with and fluidly communicating with the first wick cell and the second wick cell, respectively;
    the return passage of the WP comprises a first return passage and a second return passage separate from one another, the first return passage fluidly communicating the first EP chamber with the at least one reservoir, the second return passage fluidly communicating the second EP chamber with the at least one reservoir; and
    the two-phase multi-loop transport structure comprises:
        a first loop comprising the at least one reservoir, the first wick cell, the first EP chamber, and the first return passage; and
        a second loop comprising the at least one reservoir, the second wick cell, the second EP chamber, and the second return passage.

7. The thermal management apparatus of claim 1, wherein:
    the EP comprises a plurality of EP chambers, the plurality of EP chambers comprising a first EP chamber and a second EP chamber communicating with one another within the EP, the first and second EP chambers being aligned with and fluidly communicating with the first wick cell and the second wick cell, respectively;
    the return passage of the WP comprises a common return passage that fluidly communicates the first EP chamber with the at least one reservoir and fluidly communicates the second EP chamber with the at least one reservoir; and
    the two-phase multi-loop transport structure comprises:
        a first loop comprising the at least one reservoir, the first wick cell, the first EP chamber, and the common return passage; and
        a second loop comprising the at least one reservoir, the second wick cell, the second EP chamber, and the common return passage.

8. The thermal management apparatus of claim 1, wherein:
    the EP comprises a plurality of EP chambers, the plurality of EP chambers comprising a first EP chamber and a second EP chamber communicating with one another within the EP, the first and second EP chambers being aligned with and fluidly communicating with the first wick cell and the second wick cell, respectively;
    the return passage of the WP comprises a first return passage and a second return passage separate from one another, the first return passage fluidly communicating the first EP chamber with the at least one reservoir, the second return passage fluidly communicating the second EP chamber with the at least one reservoir; and the two-phase multi-loop transport structure comprises:
- a first loop comprising the at least one reservoir, the first wick cell, the first EP chamber, and the first return passage; and
- a second loop comprising the at least one reservoir, the second wick cell, the second EP chamber, and the second return passage.

9. The thermal management apparatus of claim 1, wherein the at least one reservoir of the CP comprises:
- a first reservoir compartment communicating with the first wick cell; and
- a second reservoir compartment separate from the first reservoir compartment and communicating with the second wick cell.

10. The thermal management apparatus of claim 1, wherein the at least one reservoir of the CP comprises a common reservoir compartment communicating with the first and second wick cells.

11. A thermal management method, comprising:
providing a thermal management apparatus comprising:
- an evaporator plate (EP) configured to receive heat from a heat source;
- a condenser plate (CP) comprising at least one reservoir; and
- a wick plate (WP) positioned between the EP and the CP, the WP comprising a plurality of wick cells and a return passage, the plurality of wick cells comprising a first wick cell and a second wick cell separate from one another and nested in the WP, the first and second wick cells respectively comprising first and second wick materials constructed to permit capillary transport of fluid from the at least one reservoir to the evaporator plate, the return passage being separate from the first and second wick cells and fluidly communicating the evaporator plate with the at least one reservoir, wherein the EP, CP, and WP establish a two-phase multi-loop transport structure including at least the plurality of wick cells, the return passage, and the at least one reservoir;

positioning a heat source in proximity to the EP;
evaporating heat-transfer fluid in or in proximity to the EP in response to heat received by the heat source to generate vapor;
transporting the vapor via the WP return passage to the at least one reservoir and condensing the vapor into a condensed liquid; and
transporting the condensed liquid along the first and second wick cells via capillary transport to the EP for further evaporation.

12. The thermal management method of claim 11, wherein the first wick material and the second wick material differ from one another in composition, size, compactness, or any combination thereof to provide the first and second wick cells with different rates of capillary transport.

13. The thermal management method of claim 11, wherein the first wick material and the second wick material are substantially identical to one another in composition, size, and compactness to provide the first and second wick cells with substantially identical rates of capillary transport.

14. The thermal management method of claim 11, wherein:
the EP comprises a plurality of EP chambers, the plurality of EP chambers comprising a first EP chamber and a second EP chamber aligned with and fluidly communicating with the first wick cell and the second wick cell, respectively.

15. The thermal management method of claim 11, wherein:
the EP comprises a plurality of EP chambers, the plurality of EP chambers comprising a first EP chamber and a second EP chamber separate from one another, the first and second EP chambers being aligned with and fluidly communicating with the first wick cell and the second wick cell, respectively;
the return passage of the WP comprises a common return passage that fluidly communicates the first EP chamber with the at least one reservoir and fluidly communicates the second EP chamber with the at least one reservoir; and
the two-phase multi-loop transport structure comprises:
- a first loop comprising the at least one reservoir, the first wick cell, the first EP chamber, and the common return passage; and
- a second loop comprising the at least one reservoir, the second wick cell, the second EP chamber, and the common return passage.

16. The thermal management method of claim 11, wherein:
the EP comprises a plurality of EP chambers, the plurality of EP chambers comprising a first EP chamber and a second EP chamber separate from one another, the first and second EP chambers being aligned with and fluidly communicating with the first wick cell and the second wick cell, respectively;
the return passage of the WP comprises a first return passage and a second return passage separate from one another, the first return passage fluidly communicating the first EP chamber with the at least one reservoir, the second return passage fluidly communicating the second EP chamber with the at least one reservoir; and
the two-phase multi-loop transport structure comprises:
- a first loop comprising the at least one reservoir, the first wick cell, the first EP chamber, and the first return passage; and
- a second loop comprising the at least one reservoir, the second wick cell, the second EP chamber, and the second return passage.

17. The thermal management method of claim 11, wherein:
the EP comprises a plurality of EP chambers, the plurality of EP chambers comprising a first EP chamber and a second EP chamber communicating with one another within the EP, the first and second EP chambers being aligned with and fluidly communicating with the first wick cell and the second wick cell, respectively;
the return passage of the WP comprises a common return passage that fluidly communicates the first EP chamber with the at least one reservoir and fluidly communicates the second EP chamber with the at least one reservoir; and
the two-phase multi-loop transport structure comprises:
- a first loop comprising the at least one reservoir, the first wick cell, the first EP chamber, and the common return passage; and
- a second loop comprising the at least one reservoir, the second wick cell, the second EP chamber, and the common return passage.

18. The thermal management method of claim 11, wherein:
the EP comprises a plurality of EP chambers, the plurality of EP chambers comprising a first EP chamber and a second EP chamber communicating with one another within the EP, the first and second EP chambers being aligned with and fluidly communicating with the first wick cell and the second wick cell, respectively;

the return passage of the WP comprises a first return passage and a second return passage separate from one another, the first return passage fluidly communicating the first EP chamber with the at least one reservoir, the second return passage fluidly communicating the second EP chamber with the at least one reservoir; and the two-phase multi-loop transport structure comprises:
- a first loop comprising the at least one reservoir, the first wick cell, the first EP chamber, and the first return passage; and
- a second loop comprising the at least one reservoir, the second wick cell, the second EP chamber, and the second return passage.

19. The thermal management method of claim 11, wherein the at least one reservoir of the CP comprises:
- a first reservoir compartment communicating with the first wick cell; and
- a second reservoir compartment separate from the first reservoir compartment and communicating with the second wick cell.

20. The thermal management method of claim 11, wherein the at least one reservoir of the CP comprises a common reservoir compartment communicating with the first and second wick cells.

* * * * *